United States Patent
Lee et al.

(10) Patent No.: US 9,978,966 B2
(45) Date of Patent: May 22, 2018

(54) STRETCHABLE DISPLAY DEVICE

(71) Applicant: SAMSUNG DISPLAY CO., LTD., Yongin-si, Gyeonggi-do (KR)

(72) Inventors: Jaeun Lee, Suwon-si (KR); Byeonghwa Choi, Seoul (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days. days.

(21) Appl. No.: 15/221,775

(22) Filed: Jul. 28, 2016

(65) Prior Publication Data
US 2017/0200779 A1 Jul. 13, 2017

(30) Foreign Application Priority Data
Jan. 11, 2016 (KR) .................. 10-2016-0003270

(51) Int. Cl.
*H01L 27/32* (2006.01)
*H01L 51/52* (2006.01)
*H01L 51/00* (2006.01)

(52) U.S. Cl.
CPC ...... *H01L 51/0097* (2013.01); *H01L 27/3267* (2013.01); *H01L 51/525* (2013.01); *H01L 51/5237* (2013.01); *H01L 2251/53* (2013.01); *H01L 2251/5338* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 7,755,605 B2 | 7/2010 | Daniel et al. | |
| 8,493,520 B2 | 7/2013 | Gay et al. | |
| 2005/0110703 A1 | 5/2005 | Riddle et al. | |
| 2011/0170074 A1 | 7/2011 | Ferren et al. | |
| 2013/0308183 A1 | 11/2013 | Vermeirsch et al. | |
| 2017/0006716 A1* | 1/2017 | Hirakata | H01L 51/0097 |

FOREIGN PATENT DOCUMENTS

| | | | |
|---|---|---|---|
| CN | 203894478 U | * | 10/2014 |
| KR | 10-2014-0099128 A | | 8/2014 |
| KR | 10-2015-0037300 A | | 4/2015 |
| KR | 10-2015-0049822 A | | 5/2015 |

* cited by examiner

*Primary Examiner* — Joseph Schoenholtz
(74) *Attorney, Agent, or Firm* — Lee & Morse, P.C.

(57) ABSTRACT

A display device includes a stretchable display panel including a first display area and a second display area, the second display area extending from the first display area in a horizontal direction substantially parallel to the first display area, and a frame including a first coupling part and a second coupling part spaced apart from the first coupling part in the horizontal direction, the second coupling part being moveable in a vertical direction normal to the horizontal direction, wherein the first and second display areas are respectively coupled to the first and second coupling parts, and the second display area is elongated in the vertical direction when the second coupling part moves in the vertical direction.

20 Claims, 19 Drawing Sheets

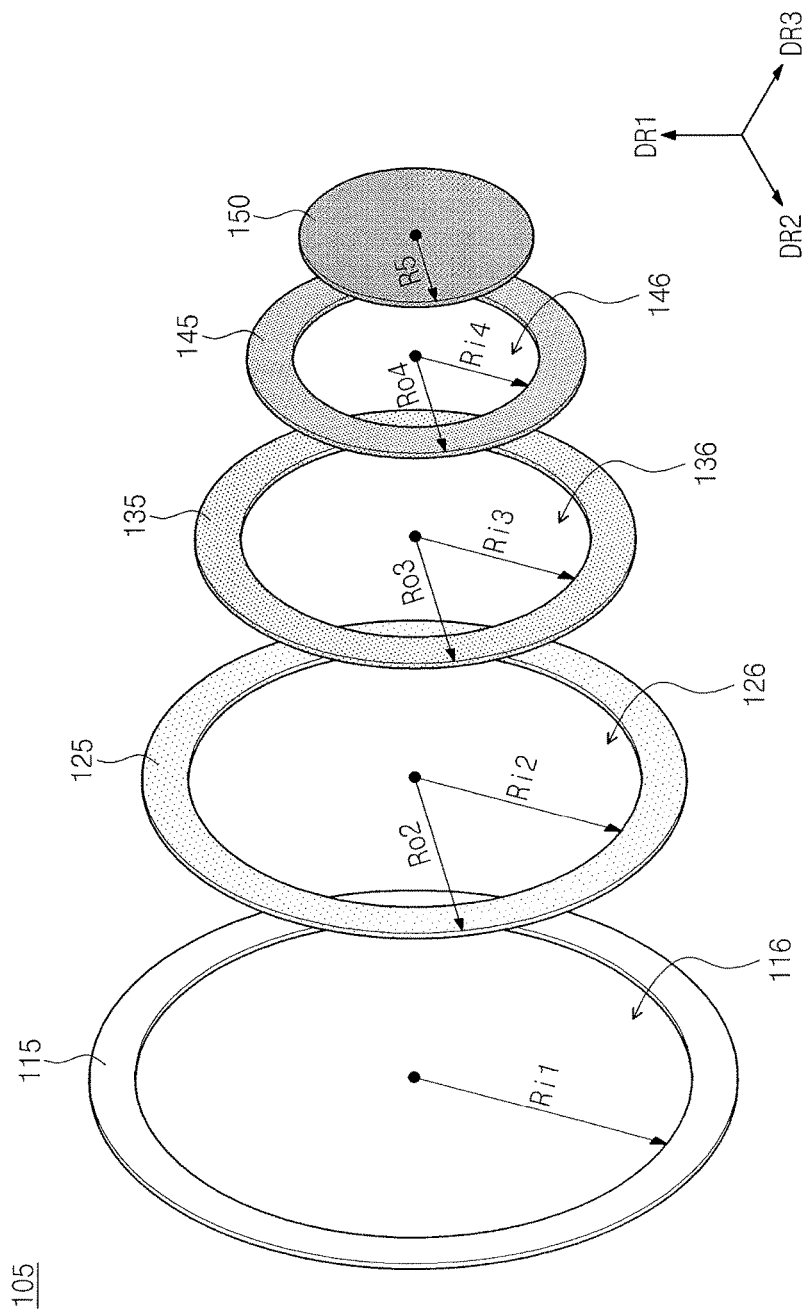

STRETCHABLE DISPLAY DEVICE

CROSS-REFERENCE TO RELATED APPLICATION

Korean Patent Application No. 10-2016-0003270, filed on Jan. 11, 2016, in the Korean Intellectual Property Office, and entitled: "Display Device," is incorporated by reference herein in its entirety.

BACKGROUND

1. Field

The present disclosure relates to a display device. More particularly, the present disclosure relates to a stretchable display device.

2. Description of the Related Art

Various display devices, e.g., a television set, a smart phone, a navigation system, a computer monitor, a game unit, etc., have been developed to provide a multimedia content. In recent years, a display device that is curved or folded depending on a user's need, i.e., a flexible display device, has been developed. Such a flexible display device includes a flexible display panel and a variety of functional members.

Further, recently, a stretchable display device has been developed. The stretchable display device is applied to various fields, e.g., IT products, clothes, paper media, etc., since the stretchable display device exhibits multiple advantages, e.g., thin thickness, light weight, and infrangible strength, and stably displays an image while being stretched.

SUMMARY

Embodiments provide a display device including a stretchable display panel including a first display area and a second display area extending from the first display area in a horizontal direction substantially parallel to the first display area and a frame including a first coupling part and a second coupling part moving to a vertical direction substantially vertical to the horizontal direction and spaced apart from the first coupling part in the horizontal direction. The first and second display areas are respectively coupled to the first and second coupling parts, and the second display area is elongated in the vertical direction when the second coupling part moves the vertical direction.

Each of the first and second display areas includes a display surface displaying an image and a rear surface opposite to the display surface, and the first and second coupling parts are respectively coupled to the rear surfaces of the first and second display areas.

The second coupling part is placed at a first position in a first state and moves in the vertical direction to be placed at a second position in a second state, the first position is spaced apart from the first coupling part by a first distance in the vertical direction, the second position is spaced apart from the first coupling part by a second distance greater than the first distance to the vertical direction.

The first coupling part moves in the vertical direction, and the first display area is elongated in the vertical direction when the first coupling part moves in the vertical direction.

The frame includes a first sub-frame and a second sub-frame, the first sub-frame includes a center portion and the first coupling part elongated from the first center portion to the horizontal direction to surround the first center portion, the second sub-frame includes a center portion and the second coupling part elongated from the second center portion to the horizontal direction to surround the second center portion, and at least a portion of the second coupling part is overlapped with the first center portion in the vertical direction.

A center of the first center portion is overlapped with a center of the second center portion in the vertical direction.

The frame includes a connecting rod coupled to the first and second sub-frames.

The connecting rod moves the second sub-frame to the vertical direction.

The frame includes a connecting string connected to the first and second sub-frames.

Each of the first and second coupling parts has a ring shape.

At least a portion of a first opening defined by an inner circumferential surface of the first coupling part is overlapped with a second opening defined by an inner circumferential surface of the second coupling part.

The first coupling part has an inner radius greater than an outer radius of the second coupling part.

The second coupling part is placed at a first position defined in the first opening in the first state.

The second coupling part is placed at a second position after moving to the vertical direction in the second state, and the second position is spaced apart from the first coupling part in the vertical direction by a predetermined distance.

The display device further includes a vertical rod extending in the vertical direction, a first horizontal rod extending in the horizontal direction to couple the first coupling part to the vertical rod, and a second horizontal rod extending in the horizontal direction to couple the second coupling part to the vertical rod.

The second horizontal rod moves in the vertical direction along the vertical rod and allows the second coupling part to move in the vertical direction.

Each of the first and second display areas includes a pixel including an organic light emitting layer.

The stretchable display panel is attached to the first and second coupling parts.

The stretchable display panel becomes concave or convex when the second coupling part moves in the vertical direction when viewed in a display surface of the first and second display areas.

Embodiments provide a display device including a frame having a first coupling part and a second coupling part moving to a vertical direction and a display panel displaying an image to the vertical direction and including first and second display areas respectively coupled to the first and second coupling parts. The second display area is elongated in the vertical direction when the second coupling part moves in the vertical direction, and the first coupling part surrounds the second coupling part when viewed in the vertical direction.

BRIEF DESCRIPTION OF THE DRAWINGS

Features will become apparent to those of ordinary skill in the art by describing in detail exemplary embodiments with reference to the attached drawings, in which:

FIG. 7A illustrates an exploded perspective view of a frame according to another exemplary embodiment of the present disclosure;

DETAILED DESCRIPTION

Figure 1:
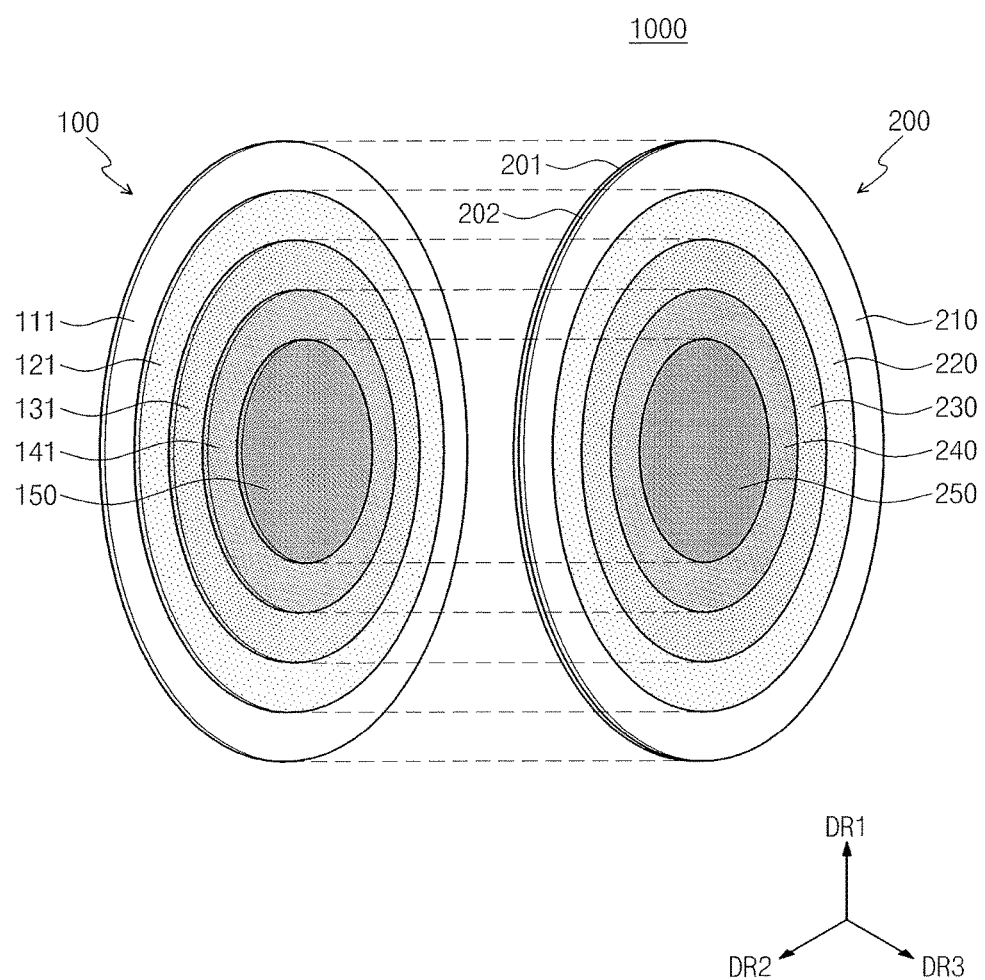
FIG. 1 illustrates a perspective view of a display device according to an exemplary embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when an element (e.g., a layer) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Further, it will also be understood that when a layer is referred to as being "connected to" or "coupled to" another element or layer, it can be directly connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout.

The use of the terms first, second, etc. do not denote any order or importance, but rather the terms first, second, etc. are used to distinguish one element from another. It is also to be understood that the singular forms "a," "an," and "the" include plural referents unless the context clearly dictates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Hereinafter, embodiments will be explained in detail with reference to the accompanying drawings.

FIG. 1 is a perspective view showing a display device 1000 according to an exemplary embodiment of the present disclosure.

Referring to FIG. 1, the display device 1000 may include a frame 100 and a stretchable display panel 200 coupled to the frame 100.

The stretchable display panel 200 includes a first substrate 201 and a second substrate 202 facing the first substrate 201. In the present exemplary embodiment, the stretchable display panel 200 may be, but is not limited to, an organic light emitting display panel. According to another embodiment, the stretchable display panel 200 may be a flat display panel, e.g., a liquid crystal display panel. In addition, although not shown in the figures, the stretchable display panel 200 includes a plurality of pixels, a plurality of gate lines respectively connected to the pixels, and a plurality of data lines respectively connected to the pixels. In the present exemplary embodiment, each pixel may include an organic light emitting layer.

The first substrate 201 may includes a pixel electrode of each pixel and a circuit driving the pixel electrode. Each of the first and second substrates 201 and 202 may include a material exhibiting softness and elasticity, e.g., sufficient elasticity to allow the first and second substrates 201 and 202 to stretch. For instance, each of the first and second substrates 201 and 202 may include a polymer processed to have softness and elasticity. For instance, each of the first and second substrates 201 and 202 may be formed of a polyester, e.g., polyethylene terephthalate, polybutylene phthalate, polyethylene naphthalate, etc., polystyrene, polycarbonate, polyether sulfone, polyarylate, polyimide, polycycloolefin, norbornene resin, poly(chlorotrifluoroethylene), or polymethyl methacrylate.

For example, as illustrated in FIG. 1, the stretchable display panel 200 may have a substantially circular shape when viewed in a third direction DR3 substantially vertical to the first and second directions DR1 and DR2, i.e., the third direction DR3 may extend along a normal to a plane defined by the first and second directions DR1 and DR2. However, the shape of the stretchable display panel 200 is not limited to the circular shape, e.g., the stretchable display panel 200 may have a polygonal shape or an oval shape when viewed in the third direction DR3. Hereinafter, for the convenience of explanation, the first and second directions DR1 and DR2 may be referred to as a horizontal direction, i.e., the first and second directions DR1 and DR2 define a horizontal plane in the horizontal direction, and the third direction DR3 may be referred to as a vertical direction, i.e., a direction normal to the horizontal plane.

The stretchable display panel 200 includes a display area. The display area includes a display surface 200a (FIG. 5) to display an image in the third direction DR3 and a rear surface 200b (FIG. 5) opposite to the display surface 200a. The display area (or the display surface) may be substantially vertical to the third direction DR3.

In addition, the display area includes a plurality of pixels. The stretchable display panel 200 includes a non-display area which does not display images. The non-display area includes a driving circuit driving the pixels and lines connecting the driving circuit and the pixels.

The display area may include first, second, third, fourth, and fifth display areas 210, 220, 230, 240, and 250. The first to fifth display areas 210 to 250 extend in the horizontal direction, e.g., extend in a plane defined by the first and second directions DR1 and DR2, and are connected to each other.

Each of the first to fourth display areas 210 to 240 has a ring shape when viewed in the third direction DR3, e.g., the first to fourth display areas 210 to 240 may have decreasing radii from the first to the fourth display areas 210 to 240. The fifth display area 250 has a circular shape when viewed in the third direction DR3, e.g., a radius of the fifth display area 250 may be smaller than that of the fourth display area 240. Centers of the first to fifth display areas 210 to 250 may be overlapped with each other in the third direction DR3, e.g., be concentric, while the first to fifth display areas 210 to 250 may not be overlapped with each other in the third direction DR3. For example, as illustrated in FIG. 1, the first to fifth display areas 210 to 250 may be arranged to contact each other and surround each other in an order of increasing radii, e.g., the fourth display area 240 is connected to the fifth display area 250 along its entire perimeter to completely surround it.

The stretchable display panel 200 may be stretched, e.g., elongated or curved, by an external force applied thereto. In more detail, a length or an area of all or a portion of the stretchable display panel 200 may be changed on a plane substantially parallel to the first and second directions DR1 and DR2. In addition, all or a portion of the stretchable display panel 200 may be curved along the first direction DR1 or the second direction DR2. Since the stretchable display panel 200 extends or is curved, an area of each of the first to fifth display areas 210 to 250 may be changed. In addition, when the external force applied to the stretchable display panel 200 is removed, the stretchable display panel 200 returns to its original shape.

The frame 100 includes a rigid material to support the stretchable display panel 200. The frame 100 may include, e.g., aluminum, iron, copper, or an alloy thereof. In addition, the frame 100 may include a polymer processed to have rigidity.

The frame 100 has a shape corresponding to that of the stretchable display panel 200 when viewed in the third direction DR3. For example, as illustrated in FIG. 1, the frame 100 may have a substantially circular shape when viewed in the third direction DR3. However, embodiments are not limited thereto, e.g., the frame 100 may have a polygonal shape or an oval shape.

The frame 100 includes first, second, third, fourth, and fifth coupling parts 111, 121, 131, 141, and 150 respectively coupled to the first, second, third, fourth, and fifth display areas 210, 220, 230, 240, and 250. Each of the first to fourth coupling parts 111 to 141 exhibits a ring shape when viewed in the third direction DR3. The fifth coupling part 150 has a substantially circular shape when viewed in the third direction DR3, e.g., the shape of the fifth coupling part 150 corresponds to that of the fifth display areas 250. Centers of the first, second, third, fourth, and fifth coupling parts 111, 121, 131, 141, and 150 are overlapped, e.g., concentric, with each other in the third direction DR3, and the ring-shaped first, second, third, fourth, and fifth coupling parts 111, 121, 131, 141, and 150 are not overlapped with each other in the third direction DR3. The first, second, and third coupling parts 111, 121, and 131 surround the second, third, and fourth coupling parts 121, 131, and 141, respectively, when viewed in the third direction DR3.

The first, second, third, fourth, and fifth coupling parts 111, 121, 131, 141, and 150 are respectively coupled (or attached) to the first, second, third, fourth, and fifth display areas 210, 220, 230, 240, and 250 by an adhesive member. The first, second, third, fourth, and fifth coupling parts 111, 121, 131, 141, and 150 may, e.g., independently, move in the third direction DR3, e.g., to push or pull corresponding first to fifth display areas 210 to 250 in the third direction DR3. The first, second, third, fourth, and fifth coupling parts 111, 121, 131, 141, and 150 may, e.g., independently, move different distances along the third direction DR3, e.g., to push or pull corresponding first to fifth display areas 210 to 250 into different positions. Due to the movement of the first, second, third, fourth, and fifth coupling parts 111, 121, 131, 141, and 150, the first, second, third, fourth, and fifth display areas 210, 220, 230, 240, and 250 may be, e.g., independently, elongated, stretched, or curved in the third direction DR3.

Accordingly, each of the display surfaces of the first, second, third, fourth, and fifth display areas 210, 220, 230, 240, and 250 may have a two-dimensional curved surface shape, and the stretchable display panel 200 provides an image having three-dimensional effect, sense of immersion, and presence to a user through the display surfaces. In the case that the display surfaces have the two-dimensional curved surface shape, the display surfaces are curved not only in the first direction DR1 but also in the second direction DR2.

Figure 2A:
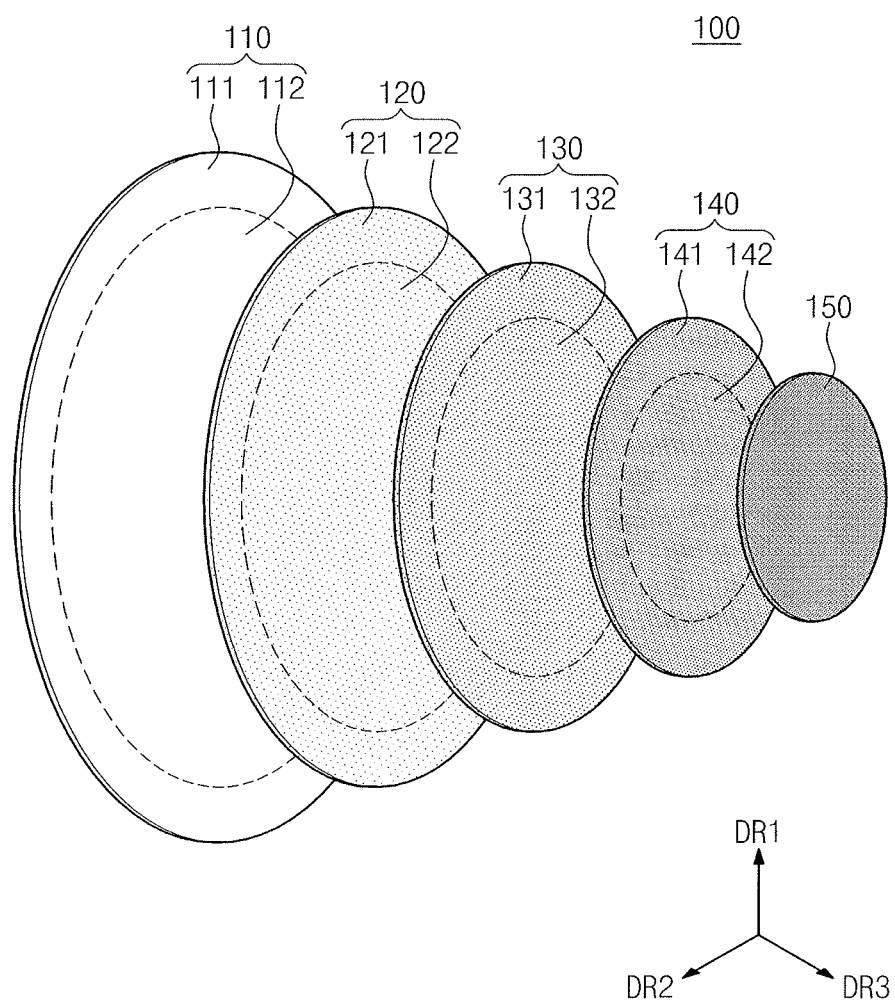
FIG. 2A illustrates an exploded perspective view of a frame according to an exemplary embodiment of the present disclosure.
Figure 2B:
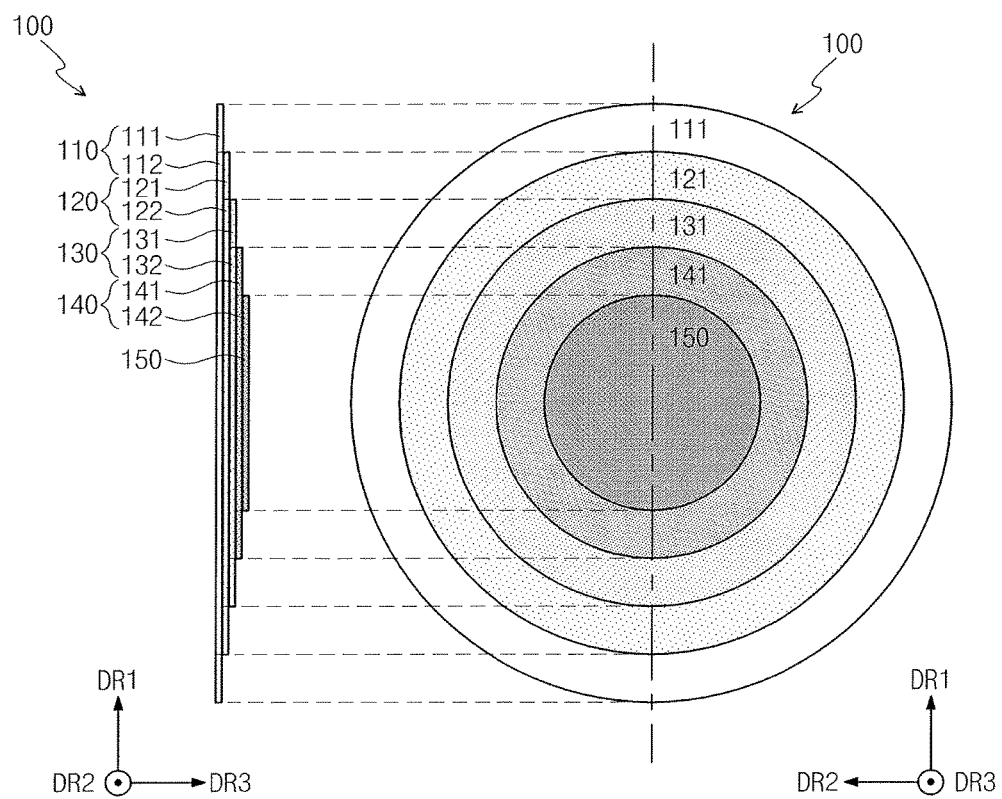
FIG. 2B illustrates a view of cross-sectional and plan views of the frame shown in FIG. 2A in a first state.

FIG. 2A is an exploded perspective view showing the frame 100 according to an exemplary embodiment of the present disclosure. FIG. 2B is a view showing cross-sectional and plan views of the frame 100 shown in FIG. 2A in a first state.

Referring to FIGS. 2A and 2B, the frame 100 includes first, second, third, and fourth sub-frames 110, 120, 130, and 140. Each of the first, second, third, and fourth sub-frames 110, 120, 130, and 140 has a disc shape substantially vertical to the third direction DR3, e.g., the third direction DR3 extends along a normal to the first through fourth sub-frames 110 through 140. The first, second, third, and fourth sub-frames 110, 120, 130, and 140 are sequentially stacked in the third direction DR3. The fifth coupling part 150 is disposed on the fourth sub-frame 140.

The first, second, third, and fourth sub-frames 110, 120, 130, and 140 include first, second, third, and fourth center portions 112, 122, 132, and 142, respectively. For example, each of the first, second, third, and fourth center portions 112, 122, 132, and 142 may have a substantially circular shape when viewed in the third direction DR3. At least portions of the first, second, third, and fourth center portions 112, 122, 132, and 142 are overlapped with each other in the third direction DR3. In addition, centers of the first, second, third, and fourth center portions 112, 122, 132, and 142 are overlapped with each other in the third direction DR3.

The first, second, third, and fourth sub-frames 110, 120, 130, and 140 include the first, second, third, and fourth coupling parts 111, 121, 131, and 141, respectively. The first, second, third, and fourth coupling parts 111, 121, 131, and 141 respectively extend radially from respective ones of the first, second, third, and fourth center portions 112, 122, 132, and 142 in the horizontal direction. That is, each of the first through fourth coupling parts 111 through 141 is integral with and surrounds a respective one of the first through fourth center portions 112 through 142. For example, the first sub-frame 110 may be a circular, flat portion including a circular center portion 112 with the first coupling part 111 surrounding the circular center portion 112. Therefore, when the first through fourth sub-frames 110 through 140 are stacked on top of each other, a thickness of a resultant structure increases from a periphery of the structure toward a center thereof (see cross-section in FIG. 2B).

Figure 3A:
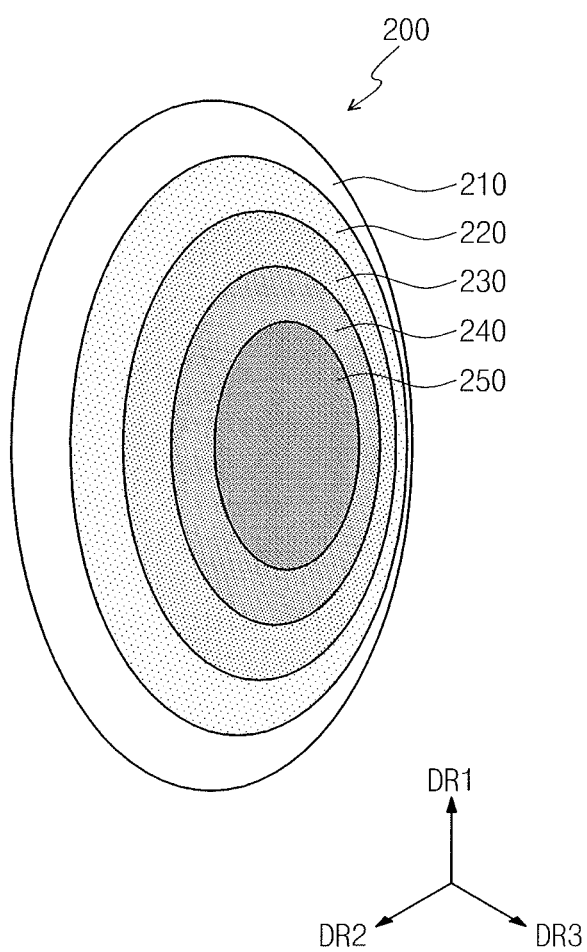
FIGS. 3A and 3B illustrate perspective and cross-sectional views of a display device including the frame shown in FIG. 2A in the first state.
Figure 3B:
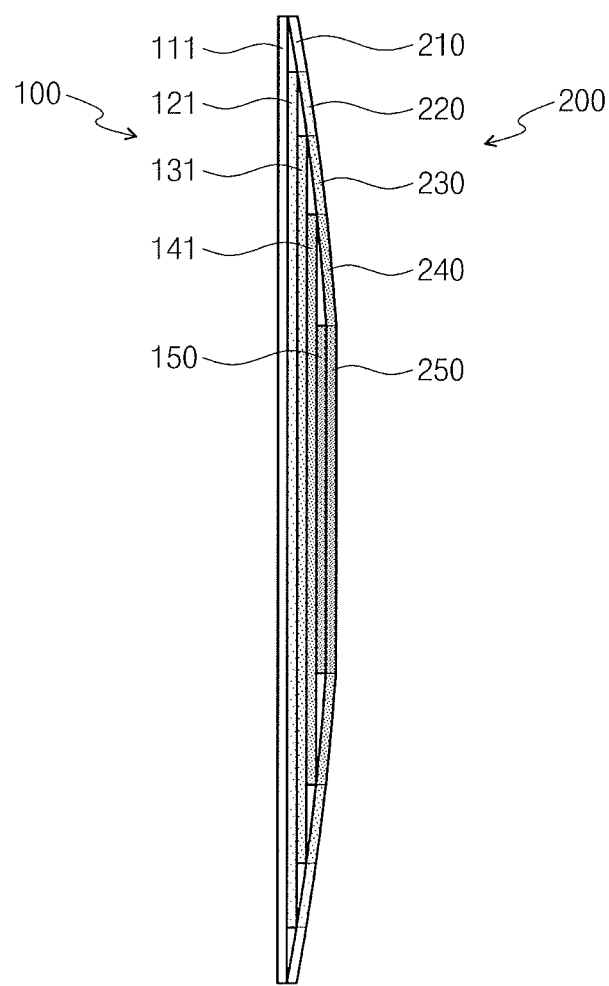

FIGS. 3A and 3B are perspective and cross-sectional views showing the display device 1000 including the frame 100 in the first state.

Referring to FIGS. 3A and 3B, the display device 1000 is in the first state. In the first state, the first, second, third, fourth, and fifth coupling parts 111, 121, 131, 141, and 150 are placed at first positions thereof. In more detail, the first, second, third, fourth, and fifth coupling parts 111, 121, 131, 141, and 150 are sequentially stacked along the third direction DR3 to make contact with each other (as illustrated in the cross-section of FIG. 2B).

In the first state, the first, second, third, fourth, and fifth display areas 210, 220, 230, 240, and 250 respectively cover the first, second, third, fourth, and fifth coupling parts 111, 121, 131, 141, and 150. Since the first, second, third, fourth, and fifth display areas 210, 220, 230, 240, and 250 are coupled to the first, second, third, fourth, and fifth coupling parts 111, 121, 131, 141, and 150, the first, second, third, fourth, and fifth display areas 210, 220, 230, 240, and 250 have shapes corresponding to the first positions of the first, second, third, fourth, and fifth coupling parts 111, 121, 131, 141, and 150. Accordingly, the display area (or the display surface) has a two-dimensional curved surface shape protruded to the third direction DR3.

In detail, as illustrated in FIG. 3B, the fifth display area 250 may protrude farther in the third direction DR3 than the first display area 210. For example, the fifth display area 250 may be positioned flush against the fifth coupling part 150, and each of the first to fourth display areas 210 to 240 may sequentially bend to contact a corresponding one of the first to fourth coupling parts 111 to 141 to define the curved surface illustrated in FIG. 3A. In the case that a thickness of the first, second, third, fourth, and fifth coupling parts 111, 121, 131, 141, and 150 is sufficiently thin, the display area (or the display surface) may be substantially flat.

Figure 4A:
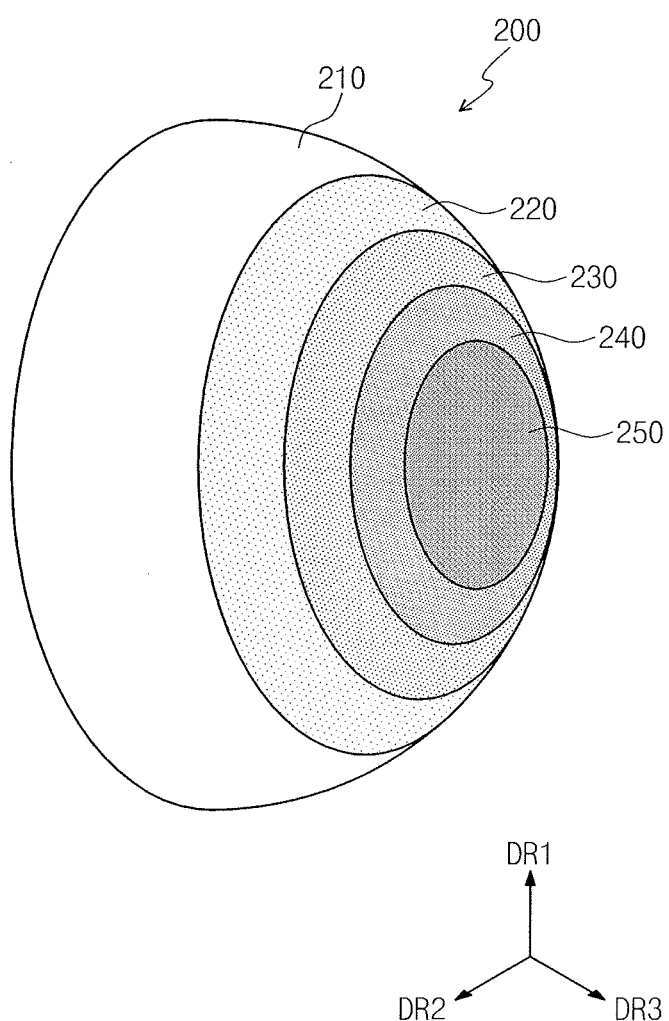
FIGS. 4A and 4B illustrate perspective and cross-sectional views of a display device including the frame shown in FIG. 2A in a second state.
Figure 4B:
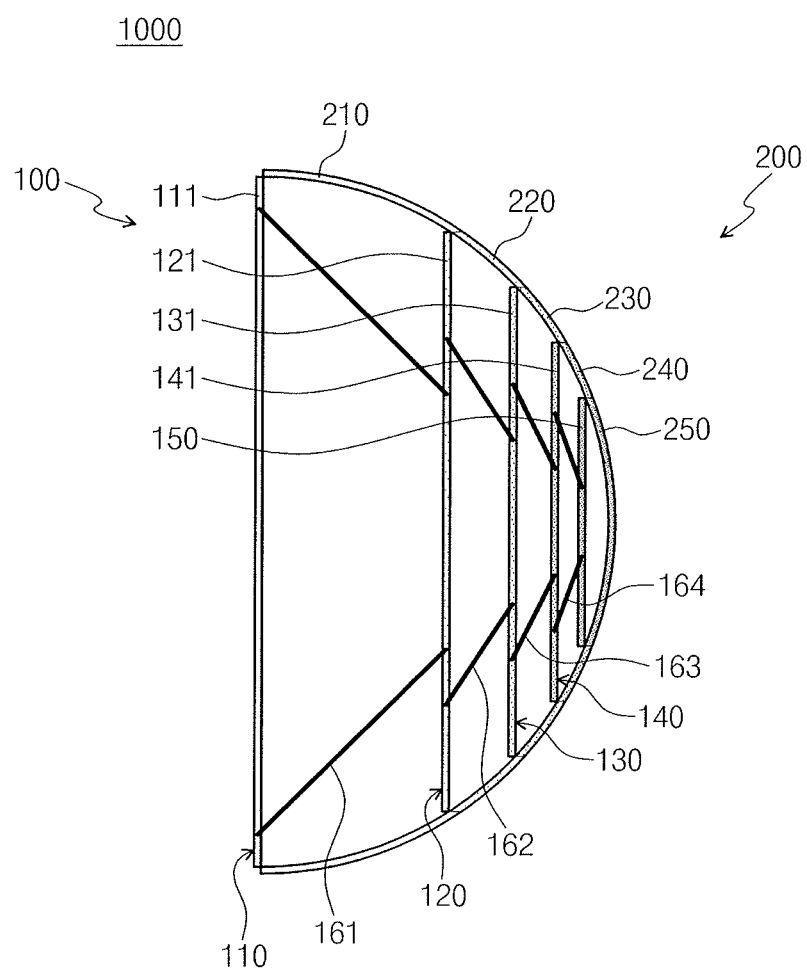

FIGS. 4A and 4B are perspective and cross-sectional views showing the display device 1000 including the frame 100 in the second state.

Referring to FIGS. 4A and 4B, the display apparatus 1000 is in the second state. In the second state, the second, third, fourth, and fifth coupling parts 121, 131, 141, and 150 move in the third direction DR3 (FIG. 4B), and the first, second, third, fourth, and fifth coupling parts 121, 131, 141, and 150 are placed at second positions thereof. The first coupling part 111 is fixed to the first position without moving. The second, third, fourth, and fifth coupling parts 121, 131, 141, and 150 are arranged in the third direction DR3 and spaced apart from each other in the third direction DR3 by a predetermined distance.

As an example, the frame 100 includes first, second, third, and fourth connecting rods 161, 162, 163, and 164. The first, second, third, and fourth connecting rods 161, 162, 163, and 164 couple the second, third, fourth, and fifth coupling parts 121, 131, 141, and 150 to each other and move the first, second, third, fourth, and fifth coupling parts 121, 131, 141, and 150 in the third direction DR3.

In more detail, both ends of the first connecting rod 161 are respectively coupled to the first and second sub-frames 110 and 120 such that the first connecting rod 161 is rotated and/or slid, and the first connecting rod 161 may move the second sub-frame 120 in the third direction DR3 in the second state. For instance, the first connecting rod 161 may be substantially parallel to the horizontal direction in the first state, e.g., completely flat against the first sub-frame 110 to allow the first and second sub-frames 110 and 120 be stacked on each other, and may be substantially parallel to the vertical direction in the second state, e.g., extended at an oblique angle with respect to the first sub-frame 110 to push the second sub-frame 120 away from the first sub-frame 110 along the third direction DR3. The first connecting rod 161 may be moved by a driver provided with the display device 1000 or a user. The driver may be, but not limited to, motors disposed at both ends of the first connecting rod 161, but it should not be limited thereto or thereby. That is, the driver may be realized by a mechanical method or a device using an electric or magnetic field to move the second, third, fourth, and fifth coupling parts 121, 131, 141, and 150. Similarly, the second to fourth connecting rods 162 to 164 may move corresponding third to fifth sub-frames 120 to 150.

In the second state, since the first, second, third, fourth, and fifth display areas 210, 220, 230, 240, and 250 are respectively coupled to the first, second, third, fourth, and fifth coupling parts 111, 121, 131, 141, and 150, the first, second, third, fourth, and fifth coupling parts 111, 121, 131, 141, and 150 move to the second positions, respectively. Therefore, the first, second, third, fourth, and fifth display areas 210, 220, 230, 240, and 250 extend in the third direction DR3 to correspond to the second positions. Thus, the first to fifth display areas 210 to 250 define a curved display area having a two-dimensional curved surface protruding in the third direction DR3. In more detail, the fifth display area 250 protrudes farther than the first display area 210 in the third direction DR3.

The display area in the second state protrudes farther in the third direction DR3 than the display area in the first state. The display area in the second state has a substantially hemispherical shape. The display area has a curvature controlled by the first, second, third, fourth, and fifth coupling parts 111, 121, 131, 141, and 150.

As described above, the stretchable display panel 200 may be elongated to have the display surface having the convex two-dimensional curved surface by the frame 100. Accordingly, the stretchable display panel 200 provides the user with an image having a three-dimensional effect, sense of immersion, and presence through the display surfaces.

Figure 5:
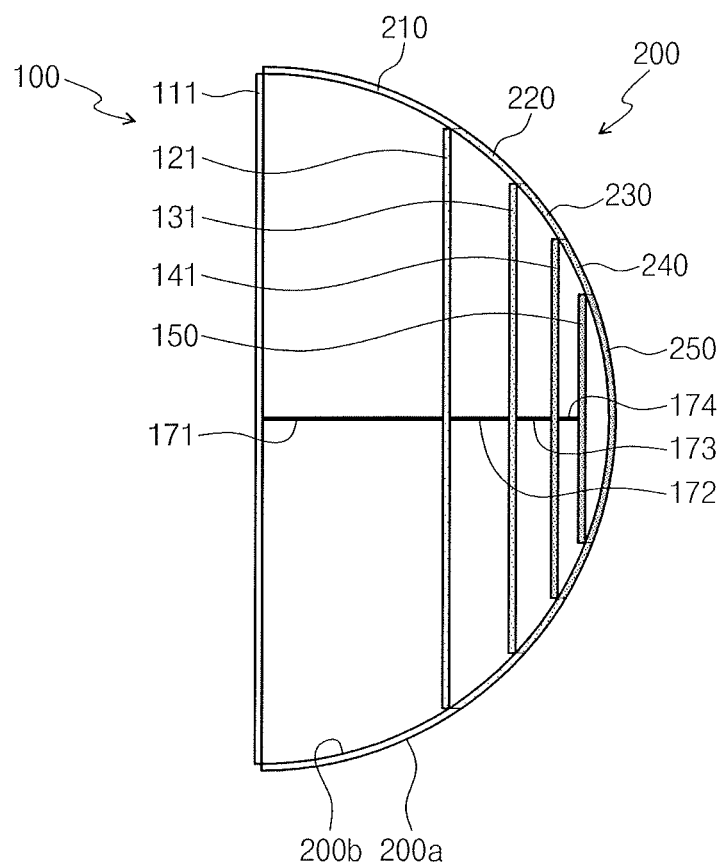
FIG. 5 illustrates a cross-sectional view of the frame shown in FIG. 2A and a stretchable display panel coupled to the frame in the second state.

FIG. 5 is a cross-sectional view showing the frame 100 and a stretchable display panel coupled to the frame in the second state according to another embodiment.

Referring to FIG. 5, the frame 100 includes first to fourth connecting strings 171 to 174. The first to fourth connecting strings 171 to 174 may sequentially move the second, third, fourth, and fifth coupling parts 121, 131, 141, and 150.

Both ends of the first connecting string 171 are coupled to the first and second coupling parts 111 and 121, respectively. Similarly, the second to fourth connecting strings 172 to 174 are respectively coupled to the other sub-frames (or the coupling parts).

Figure 6A:
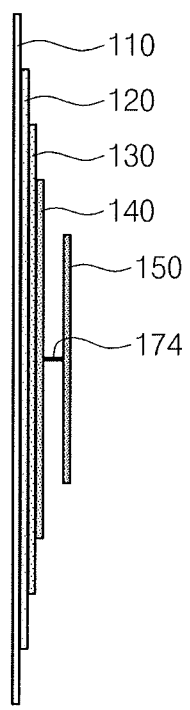
FIGS. 6A to 6C illustrate views of an operation of the frames shown in FIG. 5.
Figure 6B:
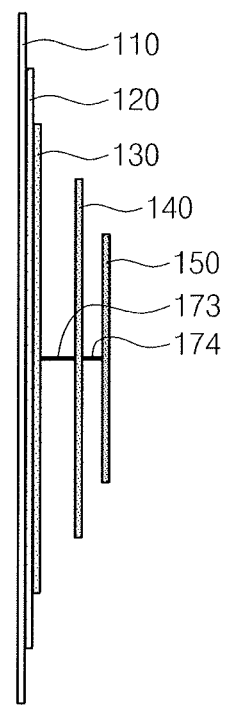
Figure 6C:
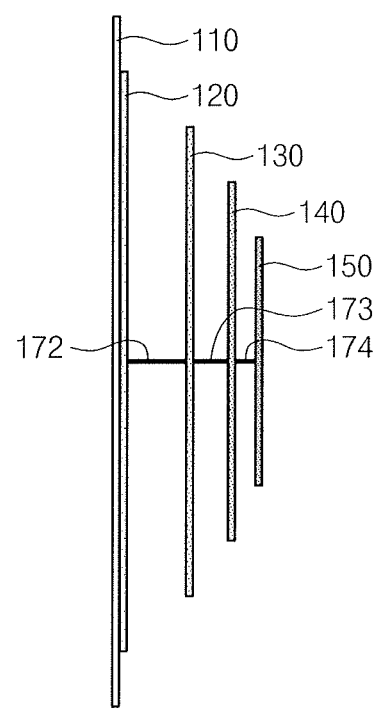

FIGS. 6A to 6C are views showing an operation of the frame 100 in FIG. 5.

Referring to FIG. 6A, the fifth coupling part 150 may move in the third direction DR3. Accordingly, the fourth connecting string 174, which is connected to the fifth coupling part 150, is pulled by the fifth coupling part 150 in the third direction DR3 and draws the fourth sub-frame 140 in the third direction DR3, thereby moving the fourth sub-frame 140 in the third direction DR3.

Then, as shown in FIG. 6B, since the fourth sub-frame 140 and the coupling part 150 move farther in the third direction DR3, the third connecting string 173, which is connected to the fourth sub-frame 140, draws the third sub-frame 130 in the third direction DR3. Accordingly, the third sub-frame 130 moves in the third direction DR3.

As shown in FIG. 6C, since the third and fourth sub-frames 130 and 140 and the coupling part 150 move farther in the third direction DR3, the second connecting string 172 draws the second sub-frame 120 in the third direction DR3. Accordingly, the second sub-frame 120 moves in the third direction DR3.

As described above, although only the fifth coupling part 150 moves in the third direction DR3, the other coupling parts (or the other sub-frames) may be sequentially moved in the third direction DR3 by the first to fourth connecting strings 171 to 174. In addition, since the first, second, third, fourth, and fifth coupling parts 111, 121, 131, 141, and 150 move by using the first to fourth connecting strings 171 to 174, the stretchable display panel 200 coupled to the frame 100 may be prevented from being applied with a large force, and thus the stretchable display panel 200 may be prevented from being damaged or torn.

Figure 7B:
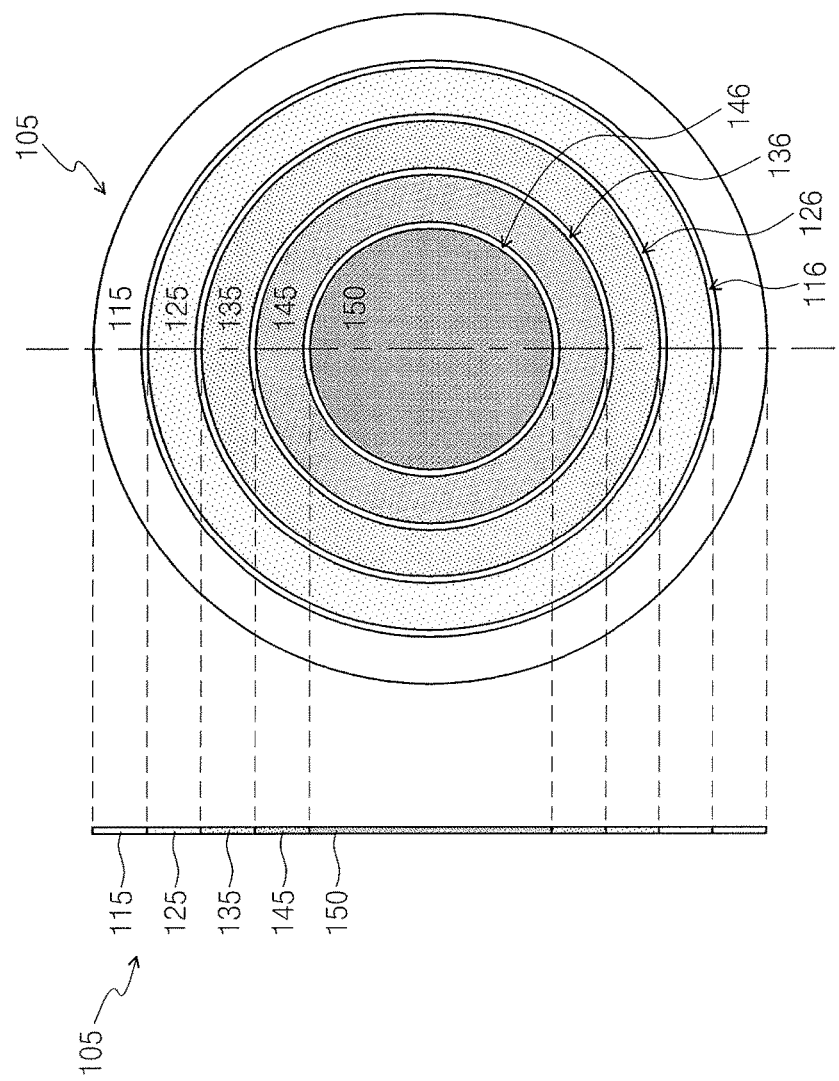
FIG. 7B illustrates a view of cross-sectional and plan views of the frame shown in FIG. 7A in the first state.

FIG. 7A is an exploded perspective view showing a frame 105 according to another exemplary embodiment of the present disclosure. FIG. 7B is a view showing cross-sectional and plan views of the frame 105 shown in FIG. 7A in the first state.

Referring to FIGS. 7A and 7B, the frame 105 includes first, second, third, and fourth coupling parts 115, 125, 135, and 145. Each of the first, second, third, and fourth coupling parts 115, 125, 135, and 145 has a substantially circular ring shape. In addition, the frame 105 includes the fifth coupling part 150. The shape of the frame 105 should not be limited to the circular ring shape. That is, the frame 105 may have a polygonal shape or an oval ring shape.

Each of the first, second, third, and fourth coupling parts 115, 125, 135, and 145 has an inner circumferential surface and an outer circumferential surface, since each of the first, second, third, and fourth coupling parts 115, 125, 135, and 145 has a ring shape. The first, second, third, and fourth coupling parts 115, 125, 135, and 145 include first, second, third, and fourth openings 116, 126, 136, and 146 respectively defined therein.

The fourth coupling part 145 has an inner radius Ri4 smaller than an inner radius R5 of the fifth coupling part 150. The fourth coupling part 145 has an outer radius Ro4 smaller than an outer radius Ro3 of the third coupling part 135. Similarly, the second coupling part 125 has an outer radius Ro2 smaller than an inner radius Ri1 of the first coupling part 115, and the third coupling part 135 has an outer radius Ro3 smaller than an inner radius Ri2 of the second coupling part 125.

FIG. 7B shows the frame 105 in the first state. As shown in FIG. 7B, the first, second, third, fourth, and fifth coupling parts 115, 125, 135, 145, and 150 are overlapped with each other in the horizontal direction in the first state. In more detail, the fifth coupling part 150 is placed at a first position defined in the fourth opening 146 of the fourth coupling part 145 and overlapped with the fourth coupling part 145 in the horizontal direction. Similarly, the second, third, and fourth coupling parts 125, 135, and 145 are respectively placed at first positions defined in the first, second, and third openings 116, 126, and 136 and overlapped with the fifth coupling part 150 in the horizontal direction.

Figure 8A:
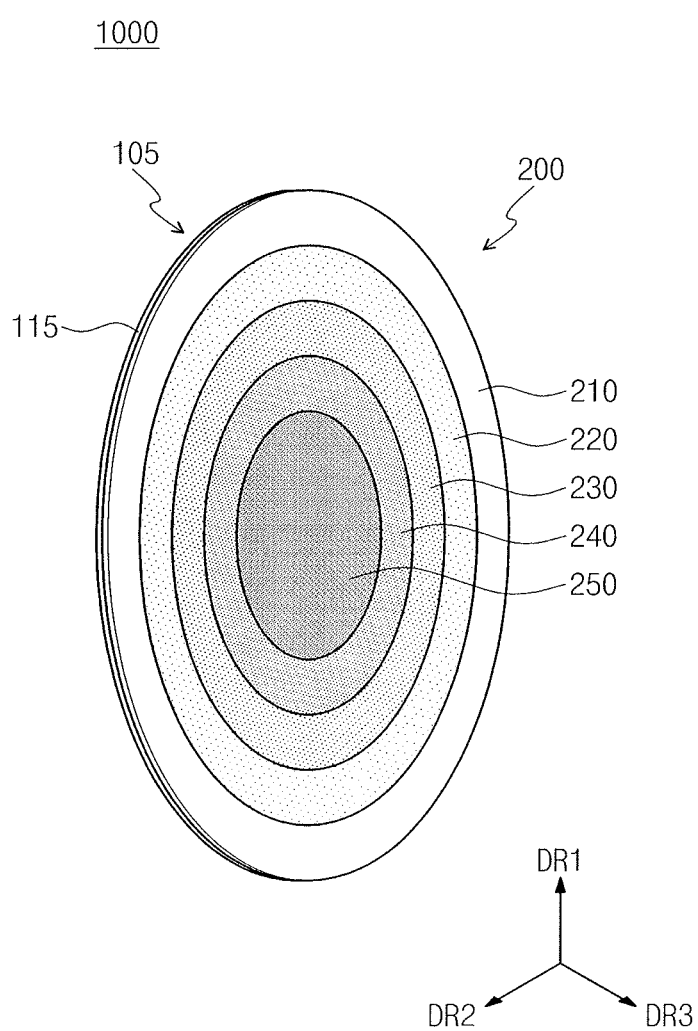
FIGS. 8A and 8B illustrate perspective and cross-sectional views of a display device including the frame shown in FIG. 7A in the first state.
Figure 8B:
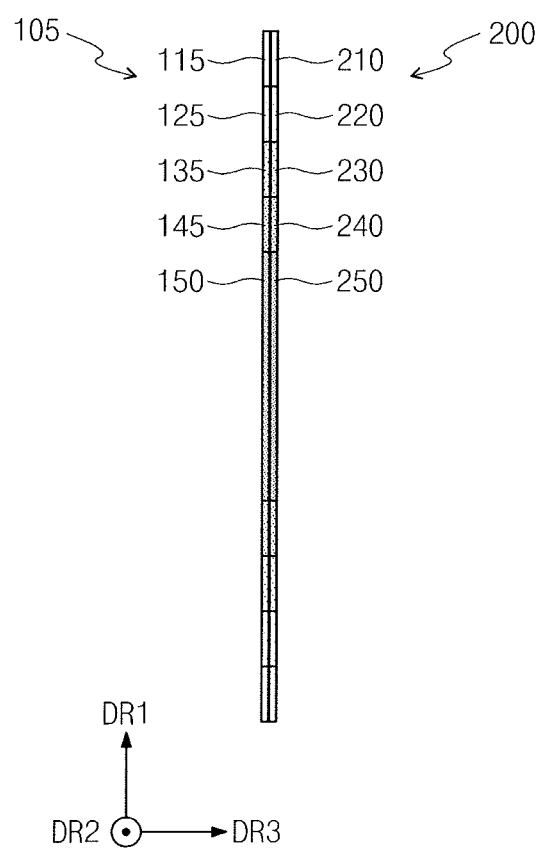

FIGS. 8A and 8B are perspective and cross-sectional views showing a display device 1000 including the frame shown in FIG. 7A in the first state.

Referring to FIGS. 8A and 8B, the display device 1000 is in the first state. In the first state, as described above, the first, second, third, fourth, and fifth coupling parts 115, 125, 135, 145, and 150 are respectively placed at the first positions.

In the first state, the first, second, third, fourth, and fifth display areas 210, 220, 230, 240, and 250 respectively cover the first, second, third, fourth, and fifth coupling parts 115, 125, 135, 145, and 150. Since the first, second, third, fourth, and fifth display areas 210, 220, 230, 240, and 250 are respectively coupled to the first, second, third, fourth, and fifth coupling parts 115, 125, 135, 145, and 150, the first, second, third, fourth, and fifth display areas 210, 220, 230, 240, and 250 have the shapes respectively corresponding to the first positions. Accordingly, the display area is substantially parallel to the first and second directions DR1 and DR2 and has a flat shape.

Figure 9A:
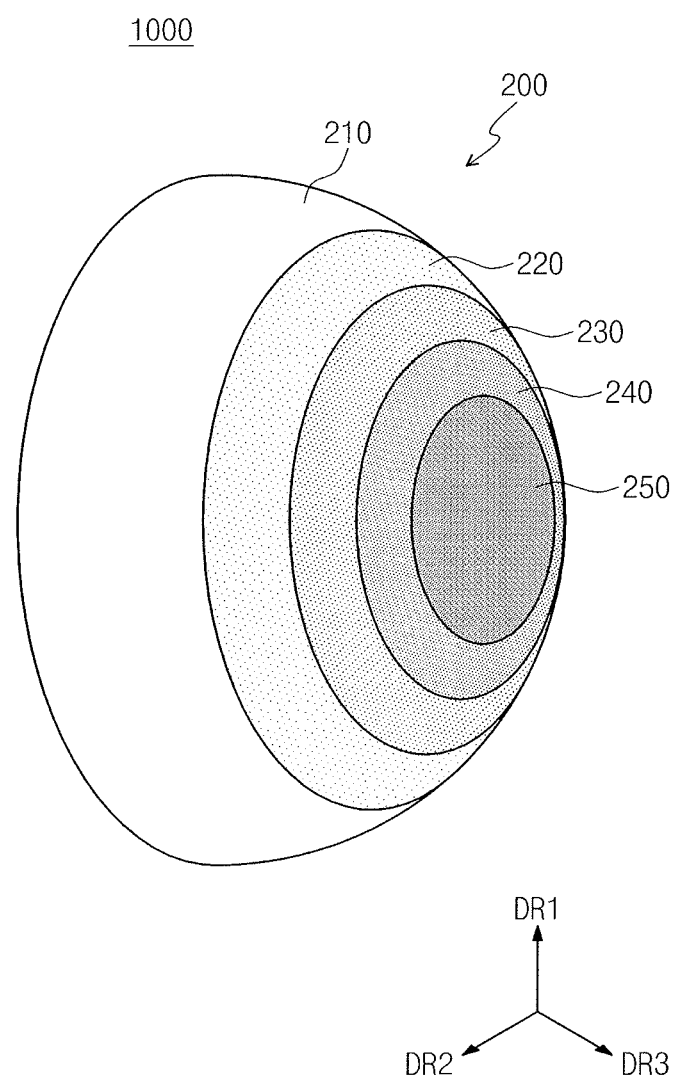
FIGS. 9A and 9B illustrate perspective and cross-sectional views of a display device including the frame shown in FIG. 7A in the second state.
Figure 9B:
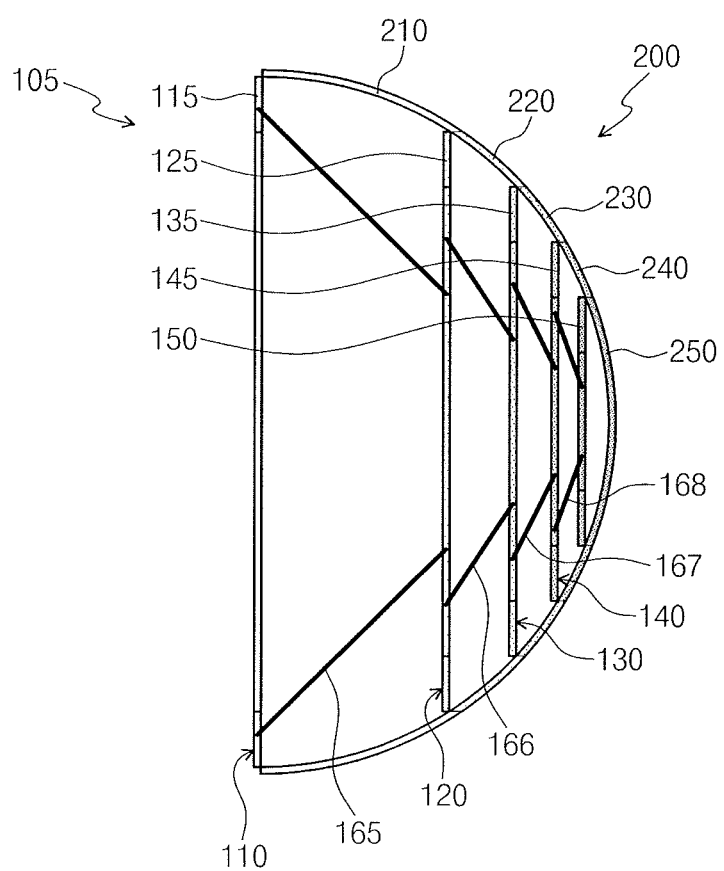

FIGS. 9A and 9B are perspective and cross-sectional views showing a display device 1000 including the frame shown in FIG. 7A in the second state.

Referring to FIGS. 9A and 9B, the display device 1000 is in the second state. In the second state, the second, third, fourth, and fifth coupling parts 125, 135, 145, and 150 move in the third direction DR3 and are placed at the second positions, respectively. For instance, the first coupling part 115 may be fixed to the first position without moving. In more detail, the first, second, third, fourth, and fifth coupling parts 115, 125, 135, 145, and 150 may be arranged spaced apart from each other by a predetermined distance in the third direction DR3.

As an example, the frame 105 includes first to fourth connecting rods 165 to 168. The first to fourth connecting rods 165 to 168 have the same structure and function as those of the first to fourth connecting rods 161 to 164 as shown in FIG. 4B, except that the first to fourth connecting rods 165 to 168 are directly coupled to the first, second, third, fourth, and fifth coupling parts 115, 125, 135, 145, and 150. That is, as described above, the first to fourth connecting rods 165 to 168 allow the first, second, third, fourth, and fifth coupling parts 115, 125, 135, 145, and 150 to be coupled to each other and the second, third, fourth, and fifth coupling parts 115, 125, 135, and 145 to move in the third direction DR3.

In the second state, the first, second, third, fourth, and fifth display areas 210, 220, 230, 240, and 250 are coupled to the first, second, third, fourth, and fifth coupling parts 111, 121, 131, 141, and 150. Accordingly, the first, second, third, fourth, and fifth coupling parts 111, 121, 131, 141, and 150 respectively move to the second positions thereof, and thus the first, second, third, fourth, and fifth display areas 210, 220, 230, 240, and 250 are elongated in the third direction DR3 to correspond to the second positions. Therefore, the display area has a two-dimensional curved surface shape protruding in the third direction DR3. In more detail, the fifth display area 250 protrudes farther in the third direction DR3 than the first display area 210. In the second state, the display area has a substantially hemispherical shape. The display area has a curvature controlled by the first, second, third, fourth, and fifth coupling parts 111, 121, 131, 141, and 150.

As described above, the stretchable display panel 200 may be elongated to have a convex two-dimensional curved surface by the frame 105. Accordingly, the stretchable display panel 200 displays an image having a three-dimensional effect, a sense of immersion, and presence to the user through the display surface.

Figure 10A:
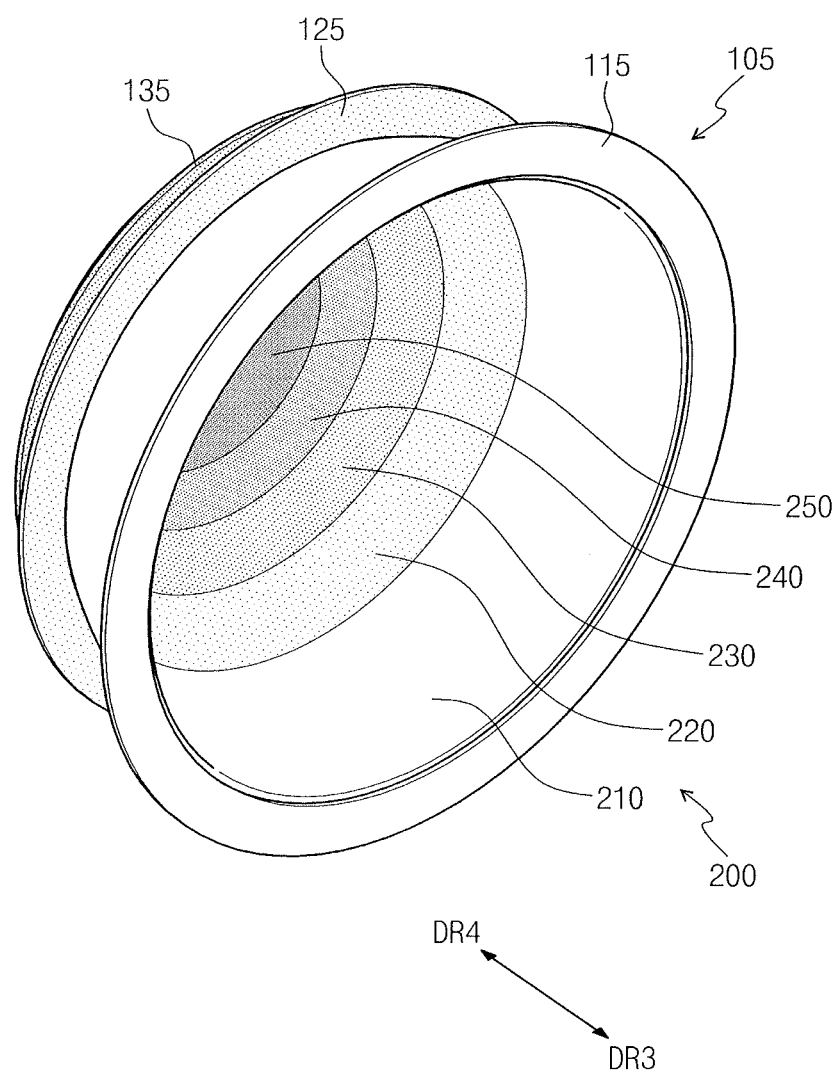
FIGS. 10A and 10B illustrate perspective and cross-sectional views of a display device including the frame shown in FIG. 7A in the second state.
Figure 10B:
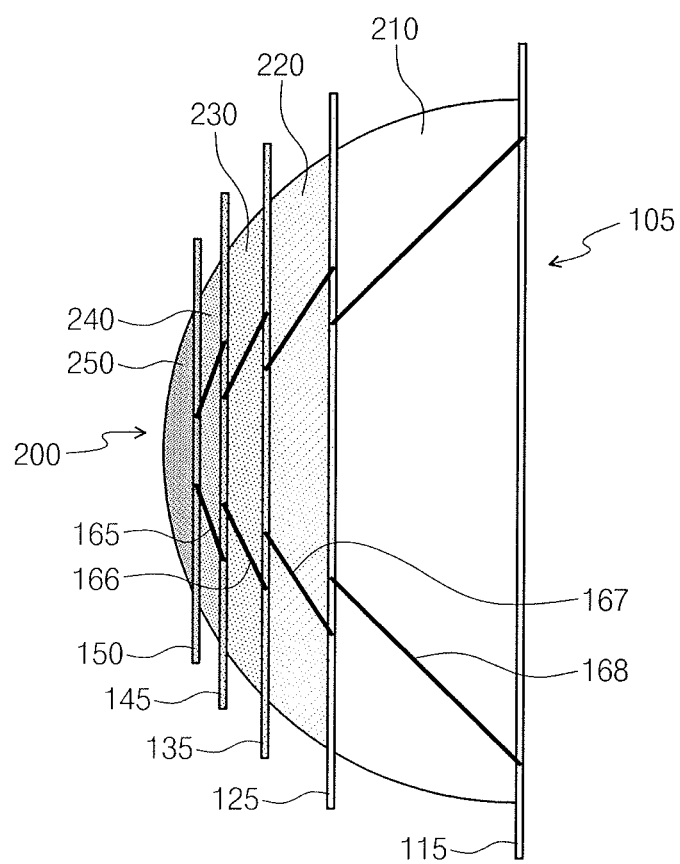

FIGS. 10A and 10B are perspective and cross-sectional views showing a display device 1000 including the frame shown in FIG. 7A in the second state.

Referring to FIGS. 10A and 10B, the display device 1000 is in the second state. In the second state, the second, third, fourth, and fifth coupling parts 125, 135, 145, and 150 move in a fourth direction DR4 opposite to the third direction DR3, and the second, third, fourth, and fifth coupling parts 125, 135, 145, and 150 are respectively placed at the second positions. In more detail, the first, second, third, fourth, and fifth coupling parts 115, 125, 135, 145, and 150 are arranged spaced apart from each other by a predetermined distance in the fourth direction DR4.

As an example, the frame 105 includes first to fourth connecting rods 165 to 168. That is, as described above, the first to fourth connecting rods 165 to 168 allow the first, second, third, fourth, and fifth coupling parts 115, 125, 135, 145, and 150 to be coupled to each other and the second, third, fourth, and fifth coupling parts 115, 125, 135, and 145 to move in the fourth direction DR4.

In the second state, the first, second, third, fourth, and fifth display areas 210, 220, 230, 240, and 250 are coupled to the first, second, third, fourth, and fifth coupling parts 111, 121, 131, 141, and 150. Accordingly, the first, second, third, fourth, and fifth coupling parts 111, 121, 131, 141, and 150 respectively move to the second positions thereof, and thus the first, second, third, fourth, and fifth display areas 210, 220, 230, 240, and 250 are elongated in the fourth direction DR4 to correspond to the second positions. Therefore, the display area has a two-dimensional curved surface shape recessed to the fourth direction DR4. In more detail, the fifth display area 250 is more recessed to the fourth direction DR4 than the first display area 210. In the second state, the display area has a substantially hemispherical shape. The display area has a curvature controlled by the first, second, third, fourth, and fifth coupling parts 111, 121, 131, 141, and 150.

As described above, the stretchable display panel 200 may be elongated to have a concave two-dimensional curved surface by the frame 105. The stretchable display panel 200 displays the image in the third direction DR3. Accordingly, the stretchable display panel 200 provides an image having three-dimensional effect, sense of immersion, and presence to the user through the display surface.

Figure 11:
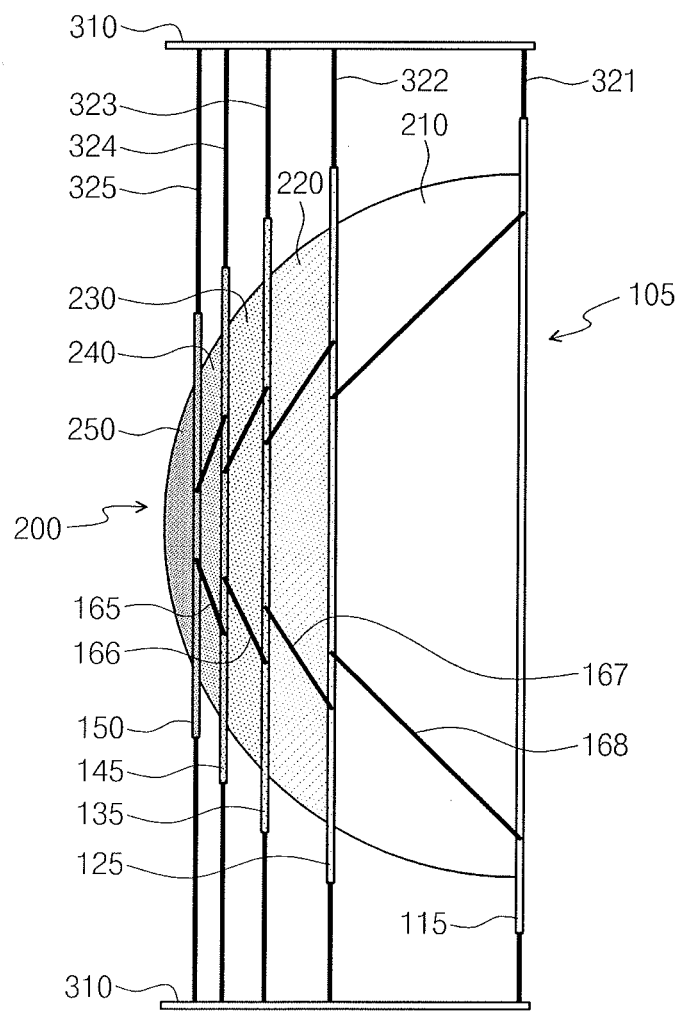
FIG. 11 illustrates a side view of a display device including the frame shown in FIG. 10B.

FIG. 11 is a side view showing a display device 1000 including the frame shown in FIG. 10B. Referring to FIG. 11, the display device 1000 may include a pair of vertical rods 310 and first to fifth horizontal rods 321 to 325.

The vertical rod 310 extends substantially parallel to the third direction DR3, and the first to fifth horizontal rods 321 to 325 extend substantially parallel to the horizontal direction. First ends of the first to fifth horizontal rods 321 to 325 are respectively connected to the first, second, third, fourth, and fifth coupling parts 115, 125, 135, 145, and 150, and second ends of the first to fifth horizontal rods 321 to 325 are coupled to the vertical rod 310 to be movable to the third and fourth directions DR3 and DR4.

In the second state, the second to fifth horizontal rods 322 to 325 move in the fourth direction DR4. The second to fifth horizontal rods 322 to 325 may be moved by the driver provided to the display device 1000 or the user. The driver may be, but not limited to, motors disposed at the other ends of the second to fifth horizontal rods 322 to 325, but it should not be limited thereto or thereby. That is, the driver may be realized by a mechanical method or a device using an electric or magnetic field to move the second, third, fourth, and fifth coupling parts 125, 135, 145, and 150.

By way of summation and review, according to embodiments, a display device includes a stretchable display panel that is elongated along the vertical direction by the frame.

Therefore, a display surface of the stretchable display panel has the two-dimensional curved surface, and the stretchable display panel provides an image having three-dimensional effect, sense of immersion, and presence to a user through the display surface.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a stretchable display panel including a first display area and a second display area, the second display area extending from the first display area in a horizontal direction substantially parallel to the first display area; and
a frame including a first coupling part and a second coupling part spaced apart from the first coupling part in the horizontal direction, the second coupling part being moveable in a vertical direction normal to the horizontal direction,
wherein the first and second display areas are respectively coupled to the first and second coupling parts, and
wherein, when the second coupling part moves in the vertical direction, the second display area is elongated in the vertical direction to have an increased surface area, as compared to a surface area before movement of the second coupling part.

2. The display device as claimed in claim 1, wherein each of the first and second display areas includes a display surface to display an image and a rear surface opposite to the display surface, and the first and second coupling parts are respectively coupled to the rear surfaces of the first and second display areas.

3. The display device as claimed in claim 1, wherein:
the second coupling part is at a first position in a first state, the second coupling part being moveable in the vertical direction to be positioned at a second position in a second state,
the first position is spaced apart from the first coupling part by a first distance in the vertical direction, and
the second position is spaced apart from the first coupling part by a second distance greater than the first distance to the vertical direction.

4. The display device as claimed in claim 1, wherein the first coupling part is moveable in the vertical direction, and the first display area is stretchable in the vertical direction when the first coupling part moves in the vertical direction.

5. The display device as claimed in claim 1, wherein:
the frame includes a first sub-frame and a second sub-frame,
the first sub-frame includes a first center portion, the first coupling part being elongated from the first center portion in the horizontal direction to surround the first center portion, and
the second sub-frame includes a second center portion, the second coupling part being elongated from the second center portion to the horizontal direction to surround the second center portion, and at least a portion of the second coupling part is overlapped with the first center portion in the vertical direction.

6. The display device as claimed in claim 5, wherein a center of the first center portion is overlapped with a center of the second center portion in the vertical direction.

7. The display device as claimed in claim 5, wherein the frame includes a connecting rod coupled to the first and second sub-frames.

8. The display device as claimed in claim 7, wherein the connecting rod moves the second sub-frame in the vertical direction.

9. The display device as claimed in claim 5, wherein the frame includes a connecting string connected to the first and second sub-frames.

10. The display device as claimed in claim 1, wherein each of the first and second coupling parts has a ring shape.

11. The display device as claimed in claim 10, wherein at least a portion of a first opening defined by an inner circumferential surface of the first coupling part is overlapped with a second opening defined by an inner circumferential surface of the second coupling part.

12. The display device as claimed in claim 11, wherein the first coupling part has an inner radius greater than an outer radius of the second coupling part.

13. The display device as claimed in claim 12, wherein the second coupling part is at a first position defined in the first opening in the first state.

14. The display device as claimed in claim 13, wherein the second coupling part is at a second position after moving in the vertical direction in the second state, and the second position is spaced apart from the first coupling part in the vertical direction by a predetermined distance.

15. The display device as claimed in claim 10, further comprising:
a vertical rod extending in the vertical direction;
a first horizontal rod extending in the horizontal direction to couple the first coupling part to the vertical rod; and
a second horizontal rod extending in the horizontal direction to couple the second coupling part to the vertical rod.

16. The display device as claimed in claim 15, wherein the second horizontal rod is moveable in the vertical direction along the vertical rod and allows the second coupling part to move in the vertical direction.

17. The display device as claimed in claim 1, wherein each of the first and second display areas includes a pixel with an organic light emitting layer.

18. The display device as claimed in claim 1, wherein the stretchable display panel is attached to the first and second coupling parts.

19. A display device, comprising:
a stretchable display panel including a first display area and a second display area, the second display area extending from the first display area in a horizontal direction substantially parallel to the first display area; and
a frame including a first coupling part and a second coupling part spaced apart from the first coupling part in the horizontal direction, the second coupling part being moveable in a vertical direction normal to the horizontal direction,
wherein the first and second display areas are respectively coupled to the first and second coupling parts, and the second display area is elongated in the vertical direction when the second coupling part moves in the vertical direction, and
wherein the stretchable display panel is concave or convex when the second coupling part moves in the vertical direction when viewed in a display surface of the first and second display areas.

20. A display device, comprising:
a frame including a first coupling part and a second coupling part moveable in a vertical direction; and
a display panel to display an image in the vertical direction, the display panel including first and second display areas respectively coupled to the first and second coupling parts,
wherein the second display area is elongated in the vertical direction when the second coupling part moves in the vertical direction, and the first coupling part surrounds the second coupling part when viewed in the vertical direction.

* * * * *